US012068753B2

(12) United States Patent
Chen et al.

(10) Patent No.: US 12,068,753 B2
(45) Date of Patent: Aug. 20, 2024

(54) SIGNAL GAIN TUNING CIRCUIT AND METHOD HAVING ADAPTIVE MECHANISM

(71) Applicant: REALTEK SEMICONDUCTOR CORPORATION, Hsinchu (TW)

(72) Inventors: Yun-Tse Chen, Hsinchu (TW); Hsuan-Ting Ho, Hsinchu (TW); Liang-Wei Huang, Hsinchu (TW); Tzung-Hua Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 181 days.

(21) Appl. No.: 17/945,481

(22) Filed: Sep. 15, 2022

(65) Prior Publication Data

US 2023/0087248 A1 Mar. 23, 2023

(30) Foreign Application Priority Data

Sep. 17, 2021 (TW) .................. 110134988

(51) Int. Cl.
*H03M 1/06* (2006.01)
*H03M 1/10* (2006.01)
*H03M 1/18* (2006.01)

(52) U.S. Cl.
CPC ....... *H03M 1/0617* (2013.01); *H03M 1/1023* (2013.01); *H03M 1/185* (2013.01)

(58) Field of Classification Search
CPC ... H03M 1/0617; H03M 1/1023; H03M 1/185
USPC .......................................... 341/118, 139, 155
See application file for complete search history.

(56) References Cited

U.S. PATENT DOCUMENTS 7,084,795 B2 * 8/2006 Smith ................. H03M 1/1028
341/120
8,890,727 B1 * 11/2014 da Silva ................ H03M 1/185
341/118

\* cited by examiner

*Primary Examiner* — Khai M Nguyen
(74) *Attorney, Agent, or Firm* — WPAT, P.C

(57) ABSTRACT

The present invention discloses a signal gain tuning circuit having adaptive mechanism. An amplifier receives an analog signal to generate a tuned analog signal to an ADC circuit to further generate a digital signal. A gain control capacitor array and the amplifier together determine a gain of the tuned analog signal. The control circuit receives an actual level of the digital signal to determine an offset of the digital signal and an estimated level to generate a tuning control signal. Each of coarse-tuning capacitors of a coarse-tuning capacitor array corresponds to a first tuning amount relative to a maximal gain. Each of fine-tuning capacitors of a fine-tuning capacitor array corresponds to a second tuning amount relative to the maximal gain. A tuning capacitor enabling combination of the coarse-tuning and fine-tuning capacitor arrays are determined according to the tuning control signal to tune the gain and decrease the offset.

12 Claims, 3 Drawing Sheets

SIGNAL GAIN TUNING CIRCUIT AND METHOD HAVING ADAPTIVE MECHANISM

BACKGROUND OF THE INVENTION

1. Field of the Invention

The present invention relates to a signal gain tuning circuit and a signal gain tuning method having adaptive mechanism.

2. Description of Related Art

An analog-to-digital conversion circuit is an important electronic component that converts a signal from an analog form to a digital form. Within a certain range of the signal, the analog-to-digital conversion circuit samples a continuous analog signal and generates digital codes accordingly.

However, when the temperature in the environment that the circuit is disposed varies or when noise is generated, the level of the input analog signal varies accordingly. Take the temperature in the environment as an example, when the temperature raises, an input wire for transmitting the analog signal equivalently becomes longer such that the signal is attenuated. On the contrary, when the temperature drops, the input wire for transmitting the analog signal equivalently becomes shorter such that the signal is amplified. If no corresponding compensation technology is used, the signal may exceed the range that the analog-to-digital conversion circuit is able to perform processing such that the system efficiency degrades.

SUMMARY OF THE INVENTION

In consideration of the problem of the prior art, an object of the present invention is to supply a signal gain tuning circuit and a signal gain tuning method having adaptive mechanism.

The present invention discloses a signal gain tuning circuit having adaptive mechanism that includes an amplifier, a gain control capacitor array, a control circuit, a coarse-tuning capacitor array and a fine-tuning capacitor array. The amplifier includes an input interface and an output interface and is configured to, according to an analog signal received from the input interface, generate a tuned analog signal at the output interface to an analog-to-digital conversion circuit. The gain control capacitor array is electrically coupled between the input interface and the output interface and is configured to determine a gain of the tuned analog signal relative to the analog signal together with the amplifier. The control circuit is configured to receive an actual level of an output digital signal of the analog-to-digital conversion circuit under an operation mode, to determine an offset between the actual level and an estimated level to further generate a tuning control signal according to the offset. The coarse-tuning capacitor array includes a plurality of coarse-tuning capacitors coupled in parallel to the gain control capacitor array, each of the coarse-tuning capacitors having a first tuning amount relative to a maximum gain of the gain. The fine-tuning capacitor array includes a plurality of fine-tuning capacitors coupled in parallel to the gain control capacitor array, each of the fine-tuning capacitors having a second tuning amount relative to the maximum gain, wherein the second tuning amount is smaller than the first tuning amount. A tuning capacitor enabling combination of the coarse-tuning capacitor array and the fine-tuning capacitor array are determined according to the tuning control signal to tune the gain and decrease the offset.

The present invention also discloses a signal gain tuning method having adaptive mechanism and used in a signal gain tuning circuit that includes steps outlined below. According to an analog signal received from an input interface, a tuned analog signal is generated at an output interface to an analog-to-digital conversion circuit by an amplifier. A gain of the tuned analog signal relative to the analog signal is determined by a gain control capacitor array electrically coupled between the input interface and the output interface together with the amplifier. An actual level of an output digital signal of the analog-to-digital conversion circuit is received under an operation mode by a control circuit, to determine an offset between the actual level and an estimated level to further generate a tuning control signal according to the offset. A tuning capacitor enabling combination of a coarse-tuning capacitor array and a fine-tuning capacitor array is determined according to the tuning control signal to tune the gain and decreased the offset. The coarse-tuning capacitor array includes a plurality of coarse-tuning capacitors coupled in parallel to the gain control capacitor array, each of the coarse-tuning capacitors having a first tuning amount relative to a maximum gain of the gain. The fine-tuning capacitor array includes a plurality of fine-tuning capacitors coupled in parallel to the gain control capacitor array, each of the fine-tuning capacitors having a second tuning amount relative to the maximum gain, wherein the second tuning amount is smaller than the first tuning amount.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a signal gain tuning circuit and a signal gain tuning method having adaptive mechanism, by disposing a coarse-tuning capacitor array and a fine-tuning capacitor array, to tune the gain of the analog signal and compensate an offset generated due to temperature or noise at the same time to avoid a false conversion result generated by an analog-to-digital conversion circuit.

Figure 1:
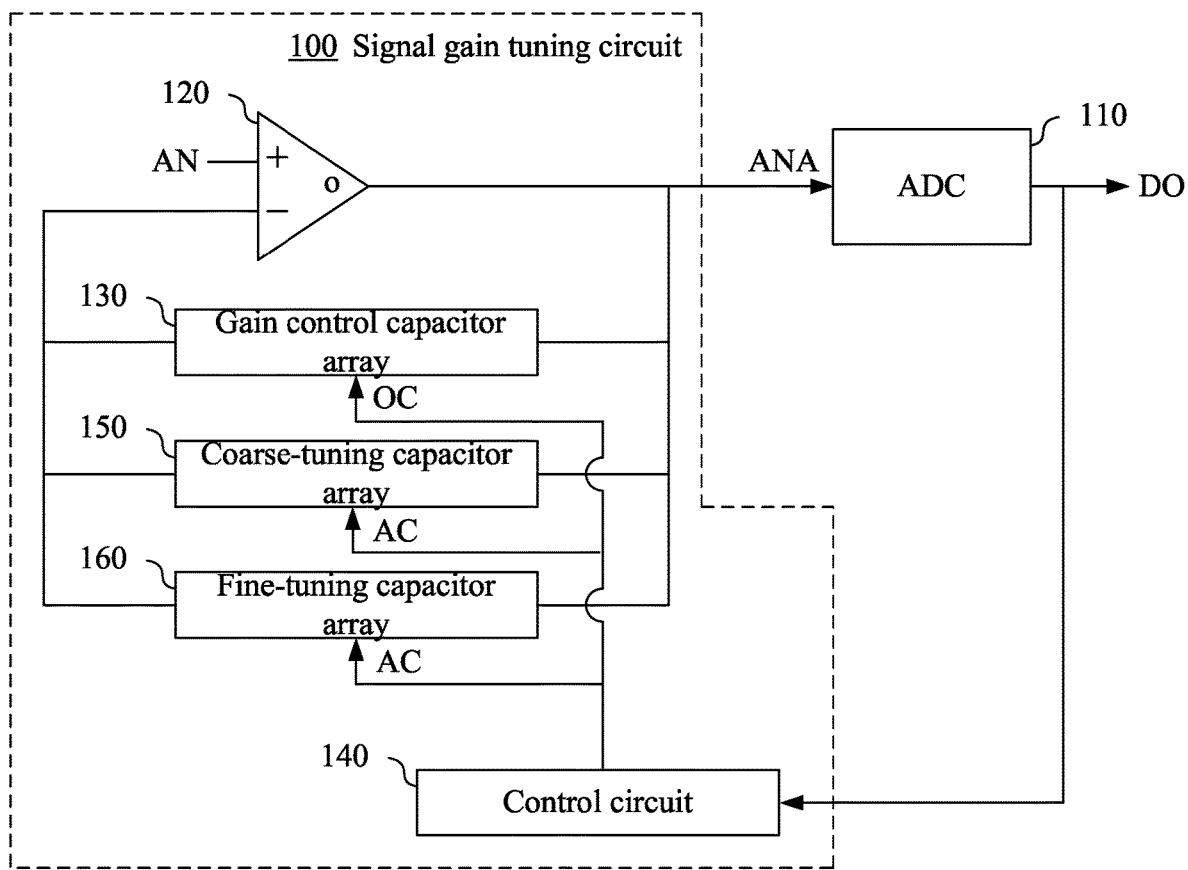
FIG. 1 illustrates a block diagram of a signal gain tuning circuit having adaptive mechanism and an analog-to-digital conversion circuit according to an embodiment of the present invention.

Reference is now made to FIG. 1. FIG. 1 illustrates a block diagram of a signal gain tuning circuit 100 having adaptive mechanism and an analog-to-digital conversion circuit 110 (abbreviated as ADC in FIG. 1) according to an embodiment of the present invention.

The signal gain tuning circuit 100 is configured to receive an analog signal AN and tune a gain of the analog signal AN to generate a tuned analog signal ANA to the analog-to-digital conversion circuit 110. The analog-to-digital conversion circuit 110 further performs analog-to-digital conversion on the tuned analog signal ANA to generate an output digital signal DO.

In the present embodiment, the signal gain tuning circuit 100 has adaptive mechanism to receive the output digital signal DO fed back from the analog-to-digital conversion circuit 110 and perform tuning when the output digital signal DO has an offset relative to an estimated level due to temperature, noise or other factors, such that the analog-to-digital conversion circuit 110 is able to receive the tuned analog signal ANA that is within an appropriate range of signal level. The false conversion result of the output digital signal DO generated due to the offset can be avoided.

The signal gain tuning circuit 100 includes an amplifier 120, a gain control capacitor array 130, a control circuit 140, a coarse-tuning capacitor array 150 and a fine-tuning capacitor array 160.

The amplifier 120 includes an input interface and an output interface and is configured to generate the tuned analog signal ANA according to the analog signal AN received from the input interface.

In the present embodiment, the amplifier 120 is an operational amplifier, in which the input interface thereof includes an non-inverting input terminal (labeled by a symbol '+' in the figure) and an inverting input terminal 1 (labeled by a symbol '−' in the figure). The output interface thereof includes an output terminal (labeled by a symbol 'o' in the figure). In an embodiment, the amplifier 120 receives the analog signal AN through the non-inverting input terminal and generates the tuned analog signal ANA at the output terminal.

The gain control capacitor array 130 is electrically coupled between the input interface and the output interface and is configured to determine a gain of the tuned analog signal ANA relative to the analog signal AN together with the amplifier 120. In the present embodiment, the gain control capacitor array 130 is electrically coupled between the inverting input terminal and the output terminal. However, the present invention is not limited thereto.

Figure 2:
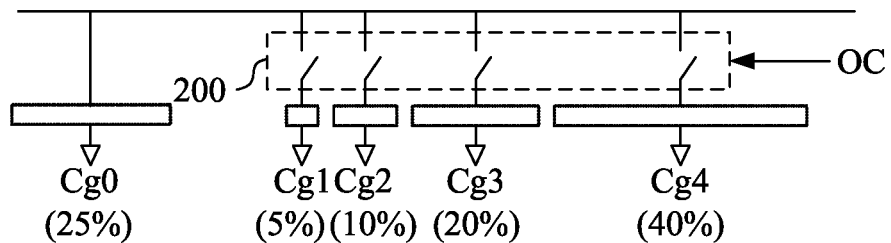
FIG. 2 illustrates a more detailed circuit diagram of the gain control capacitor array according to an embodiment of the present invention.

Reference is now made to FIG. 2. FIG. 2 illustrates a more detailed circuit diagram of the gain control capacitor array 130 according to an embodiment of the present invention.

In an embodiment, the gain control capacitor array 130 includes a fundamental gain capacitor Cg0 and a plurality of gain control capacitors Cg1~Cg4 coupled in parallel. The fundamental gain capacitor Cg0 is kept to be enabled and the gain control capacitors Cg2~Cg42 are enabled or disabled by using such as, but not limited a switch circuit 200.

The gain control capacitors Cg1~Cg4 have a plurality of weighted binary tuning amounts relative to a maximum gain. More specifically, relative to the maximum gain, the tuning amounts of the gain control capacitors Cg2~Cg4 are twice, 4 times and 8 times of the tuning amount of the gain control capacitors Cg1 relative to the maximum gain.

In an embodiment, the maximum gain that the gain control capacitor array 130 has is 100%. The tuning amount of the fundamental gain capacitor Cg0 relative to the maximum gain is configured to be 25%. The tuning amounts of the gain control capacitors Cg1~Cg4 relative to the maximum gain are configured to be 5%, 10%, 20% and 40%.

The control circuit 140 is configured to generate an the operation control signal OC such that the gain control capacitor array 130 determines a gain capacitor enabling combination according to the operation control signal OC.

Figure 3:
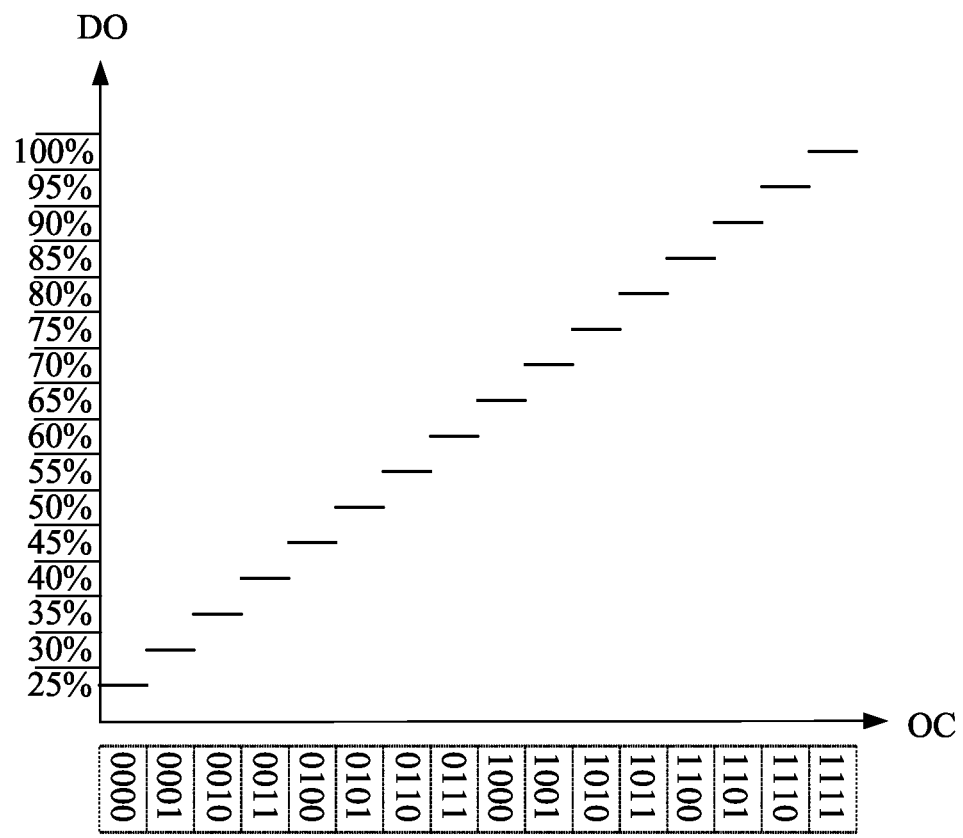
FIG. 3 illustrates a diagram of the tuning amounts of the gain generated by the gain control capacitors under the control of the operation control signal such that the analog-to-digital conversion circuit generates different levels of the output digital signal according to an embodiment of the present invention according to an embodiment of the present invention.

Reference is now made to FIG. 3. FIG. 3 illustrates a diagram of the tuning amounts of the gain generated by the gain control capacitors Cg1~Cg4 under the control of the operation control signal OC such that the analog-to-digital conversion circuit 110 generates different levels of the output digital signal DO according to an embodiment of the present invention.

Since the number of the gain control capacitors Cg1~Cg4 is 4, the operation control signal OC can perform controlling in a 4-bit form. As a result, as illustrated in FIG. 3, the Y-axis is the operation control signal OC expressed in the 4-bit form and the X-axis is the corresponding amount of gain.

When the fundamental gain capacitor Cg0 is kept to be enabled, different enabling combinations of the gain control capacitors Cg1~Cg4 are generated according to the operation control signal OC having the combinations of (0000), (0001), (0010), . . . (1111), so as to make the gain reach 25%~100% of the maximum gain, in which 16 ($2^4$) different levels of gain can be generated.

It is appreciated that the configuration of the gain control capacitor array 130 described above is merely an example. In other embodiments, the gain control capacitor array 130 can be implemented by using other configurations.

In practical operation, the control circuit 140 is configured to generate the operation control signal OC according to a transmission wire length between the signal gain tuning circuit 100 and the analog-to-digital conversion circuit 110 under a system initialization mode such that the gain control capacitor array 130 determines the gain capacitor enabling combination according to the operation control signal OC.

Further, the gain control capacitor array 130 operates according to the gain capacitor enabling combination under an operation mode and no change is made to the gain control capacitor array 130 under the operation mode. Such a gain capacitor enabling combination determines the gain of the tuned analog signal ANA relative to the analog signal AN together with the amplifier 120.

However, the capacitance of the gain control capacitor array 130 varies due to the effect of the temperature or noise and further affects the tuning amount of each of these capacitors relative to the maximum gain. As a result, the control circuit 140 determines a tuning capacitor enabling combination of the coarse-tuning capacitor array 150 and the fine-tuning capacitor array 160 according to the output digital signal DO fed back from the analog-to-digital conversion circuit 110 to accomplish the compensation mechanism.

Figure 4:
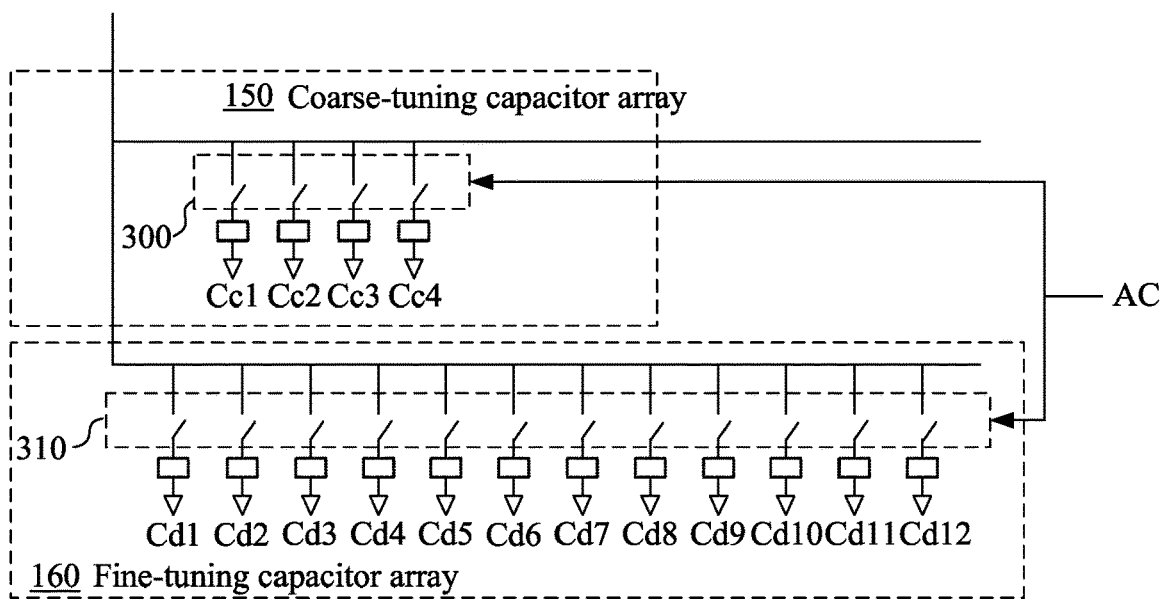
FIG. 4 illustrates a more detailed circuit diagram of the coarse-tuning capacitor array and the fine-tuning capacitor array according to an embodiment of the present invention.

Reference is now made to FIG. 4. FIG. 4 illustrates a more detailed circuit diagram of the coarse-tuning capacitor array 150 and the fine-tuning capacitor array 160 according to an embodiment of the present invention.

The coarse-tuning capacitor array 150 includes a plurality of coarse-tuning capacitors Cc1~Cc4 coupled in parallel to the gain control capacitor array 130, each of the coarse-tuning capacitors having a first tuning amount relative to a maximum gain of the gain. In an embodiment, the first tuning amount of each of the coarse-tuning capacitors Cc1~Cc4 relative to the maximum gain equals to the tuning amount of the gain control capacitors Cg1 relative to the maximum gain, which is 5% of the maximum gain.

The coarse-tuning capacitors Cc1~Cc2 are configured to be enabled under the system initialization mode, wherein the coarse-tuning capacitors Cc1~Cc2 are disabled according to the tuning capacitor enabling combination under the operation mode to tune the gain down. On the other hand, the coarse-tuning capacitors Cc3~Cc4 are configured to be disabled under the system initialization mode, wherein the coarse-tuning capacitors Cc3~Cc4 are enabled according to the tuning capacitor enabling combination under the operation mode to tune the gain up. As a result, under the operation mode, the coarse-tuning capacitors Cc1~Cc4 is configured to tune the gain up or down.

The fine-tuning capacitor array 160 includes a plurality of fine-tuning capacitors Cd1~Cd12 coupled in parallel to the gain control capacitor array 130, each of the fine-tuning capacitors Cd1~Cd12 having a second tuning amount relative to the maximum gain, wherein the second tuning amount is smaller than the first tuning amount. In an embodiment, the fine-tuning capacitor array 160 includes first fine-tuning capacitors Cd1~Cd10 and second fine-tuning capacitors Cd11~Cd12.

The first fine-tuning capacitors Cd1~Cd10, when being all enabled, have a first total tuning amount equaling to the first tuning amount of each of the coarse-tuning capacitors Cc1~Cc4 relative to the maximum gain. In the present embodiment, the second tuning amount of each of the first fine-tuning capacitors Cd1~Cd10 relative to the maximum gain is 1/10 of the first tuning amount, i.e., 0.5% of the maximum gain.

The second fine-tuning capacitors Cd11~Cd120, when being all enabled, have a second total tuning amount equaling to a process variation tuning amount corresponding to the first tuning amount of each of the coarse-tuning capacitors Cc1~Cc4. In an embodiment, if process variation has an effect of 20%, the required process variation tuning amount becomes 1% of the maximum gain (20% out of 5% of the maximum gain). As a result, two second fine-tuning capacitors Cd11~Cd12 having the second tuning amount (0.5% of the maximum gain) are required to be disposed.

The coarse-tuning capacitors Cc1~Cc4 and the fine-tuning capacitors Cd1~Cd12 are enabled or disabled according to the operation of such as, but not limited to a switch circuit 300 and a switch circuit 310. By using different enabling combinations, different gain tuning results having different levels can be obtained according to the operation of the coarse-tuning capacitors Cc1~Cc4 and the fine-tuning capacitors Cd1~Cd12.

It is appreciated that in order to obtain a linear accumulated tuning result, the coarse-tuning capacitors Cc1~Cc4 and the fine-tuning capacitors Cd1~Cd12 are enabled in an order to accumulate the tuning amount, unlike the capacitors of the gain control capacitor array 130 that can be enabled in any order depending on the requirements.

It is appreciated that the configuration of the coarse-tuning capacitor array 150 and the fine-tuning capacitor array 160 described above is merely an example. In other embodiments, the coarse-tuning capacitor array 150 and the fine-tuning capacitor array 160 can be implemented by using other configurations.

In practical operation, the control circuit 140 is configured to determine a plurality of enabling combinations of the coarse-tuning capacitors Cc1~Cc4 and fine-tuning capacitors Cd1~Cd12 corresponding to a plurality of tuning amounts within a predetermined tuning range under a calibration mode. For example, under the calibration mode, the control circuit 140 uses the switch circuit 300 and the switch circuit 310 to control the coarse-tuning capacitor array 150 and the fine-tuning capacitor array 160 to find all the enabling combinations corresponding to the tuning amounts in the tuning range of −10%~+10%.

In an example, corresponding to the tuning range that either not tune or tunes up the gain (0~10%), the control circuit 140 sets the enabling combinations of, such as but not limited to, disabling all the coarse-tuning capacitors Cc1~Cc4 and the fine-tuning capacitors Cd1~Cd12, gradually enabling the capacitors from the fine-tuning capacitor Cd1 to the fine-tuning capacitor Cd9 one by one, only enabling the coarse-tuning capacitor Cc3, enabling the coarse-tuning capacitors Cc3 and gradually enabling the capacitors from the fine-tuning capacitor Cd1 to the fine-tuning capacitor Cd10 one by one, only enabling the coarse-tuning capacitors Cc3 and Cc4, and enabling the coarse-tuning capacitors Cc3 and Cc4 gradually enabling the capacitors from the fine-tuning capacitor Cd1 to the fine-tuning capacitor Cd11 one by one.

Corresponding to the tuning range that either not tune or tunes down the gain (−10%~0%), the control circuit 140 sets the enabling combinations of, such as but not limited to, only enabling the coarse-tuning capacitor Cc2, enabling the coarse-tuning capacitors Cc2 and gradually enabling the capacitors from the fine-tuning capacitor Cd1 to the fine-tuning capacitor Cd8 one by one and only enabling the coarse-tuning capacitors Cc2 and Cc1.

In such an example, corresponding to the tuning range of −10%~+10%, the control circuit 140 can set 41 different enabling combinations having different tuning amounts.

It is appreciated that the tuning range described above is merely an example. In other embodiments, the control circuit 140 may set different tuning ranges depending on the requirements. Further, the enabling combinations that the control circuit 140 determines are merely an example. In other embodiments, the number and the order of the enabling combinations can be different according to the size of the tuning range and the actual tuning amounts of the coarse-tuning capacitors and fine-tuning capacitors generated due to the process variation.

The control circuit 140 is configured to receive an actual level of the output digital signal DO of the analog-to-digital conversion circuit 110 under the operation mode, to determine an offset between the actual level and an estimated level to further generate a tuning control signal according to the offset. In an embodiment, the control circuit 140 can generate the estimated level based on the values obtained from history according to the intensity of the analog signal AN. The control circuit 140 further determines the offset according to a maximum difference or an average power difference between the actual level and the estimated level.

In an embodiment, the control circuit 140 stores the corresponding relation of the tuning amounts and the enabling combinations as a look-up table in a memory (not illustrated in the figure) further included in the signal gain tuning circuit 100. After obtaining the information of the offset described above, the control circuit 140 calculates the tuning amount required to compensate the offset so as to retrieve the corresponding enabling combination from the look-up table according to the tuning amount to generate the tuning control signal AC. As a result, the tuning capacitor enabling combination of the coarse-tuning capacitor array 150 and the fine-tuning capacitor array 160 is determined according to the tuning control signal AC to further tune the gain to decrease the offset.

As a result, the signal gain tuning circuit of the present invention, by disposing the coarse-tuning capacitor array and the fine-tuning capacitor array, tunes the gain of the analog signal and compensates the offset generated due to temperature or noise at the same time to avoid the false conversion result generated by the analog-to-digital conversion circuit.

Figure 5:
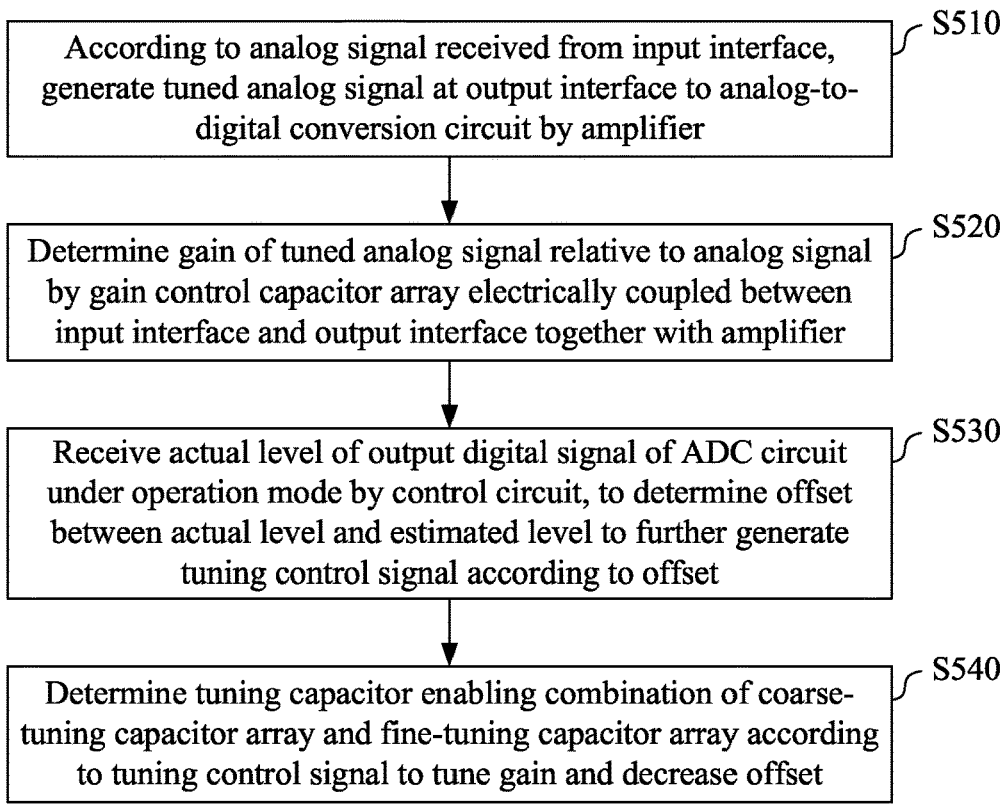
FIG. 5 illustrates a flow chart of a signal gain tuning method having adaptive mechanism according to an embodiment of the present invention.

Reference is now made to FIG. 5. FIG. 5 illustrates a flow chart of a signal gain tuning method 500 having adaptive mechanism according to an embodiment of the present invention.

In addition to the apparatus described above, the present disclosure further provides the signal gain tuning method 500 having adaptive mechanism that can be used in such as, but not limited to, the signal gain tuning circuit 100 in FIG. 1. As illustrated in FIG. 5, an embodiment of the signal gain tuning method 500 includes the following steps.

In step S510, according to the analog signal AN received from the input interface, the tuned analog signal ANA is generated at the output interface to the analog-to-digital conversion circuit 110 by the amplifier 120.

In step S520, the gain of the tuned analog signal ANA relative to the analog signal AN is determined by the gain control capacitor array 130 electrically coupled between the input interface and the output interface together with the amplifier 120.

In step S530, the actual level of the output digital signal DO of the analog-to-digital conversion circuit 110 is received under the operation mode by the control circuit 140, to determine the offset between the actual level and the estimated level to further generate the tuning control signal AC according to the offset.

In step S540, the tuning capacitor enabling combination of the coarse-tuning capacitor array 150 and the fine-tuning capacitor array 160 is determined according to the tuning control signal AC to tune the gain and decrease the offset.

It is appreciated that the embodiments described above are merely an example. In other embodiments, it should be appreciated that many modifications and changes may be made by those of ordinary skill in the art without departing, from the spirit of the disclosure.

In summary, the present invention discloses the signal gain tuning circuit and the signal gain tuning method having adaptive mechanism that, by disposing the coarse-tuning capacitor array and the fine-tuning capacitor array, tune the gain of the analog signal and compensate the offset generated due to temperature or noise at the same time to avoid the false conversion result generated by the analog-to-digital conversion circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A signal gain tuning circuit having adaptive mechanism comprising:
    an amplifier comprising an input interface and an output interface and configured to, according to an analog signal received from the input interface, generate a tuned analog signal at the output interface to an analog-to-digital conversion circuit;
    a gain control capacitor array electrically coupled between the input interface and the output interface and configured to determine a gain of the tuned analog signal relative to the analog signal together with the amplifier;
    a control circuit configured to receive an actual level of an output digital signal of the analog-to-digital conversion circuit under an operation mode, to determine an offset between the actual level and an estimated level to further generate a tuning control signal according to the offset;
    a coarse-tuning capacitor array comprising a plurality of coarse-tuning capacitors coupled in parallel to the gain control capacitor array, each of the coarse-tuning capacitors having a first tuning amount relative to a maximum gain of the gain; and
    a fine-tuning capacitor array comprising a plurality of fine-tuning capacitors coupled in parallel to the gain control capacitor array, each of the fine-tuning capacitors having a second tuning amount relative to the maximum gain, wherein the second tuning amount is smaller than the first tuning amount;
    wherein a tuning capacitor enabling combination of the coarse-tuning capacitor array and the fine-tuning capacitor array are determined according to the tuning control signal to tune the gain and lower the offset.

2. The signal gain tuning circuit of claim 1, wherein the control circuit is further configured to determine a plurality of enabling combinations of the coarse-tuning capacitors and the fine-tuning capacitors corresponding to a plurality of tuning amounts within a predetermined tuning range under a calibration mode, to further select one of the enabling combinations according to the offset under the operation mode to generate the tuning control signal.

3. The signal gain tuning circuit of claim 1, wherein the gain control capacitor array comprises a plurality of gain control capacitors coupled in parallel and having a plurality of weighted binary tuning amounts relative to the maximum gain;
    the control circuit is further configured to generate an operation control signal according to a transmission wire length between the signal gain tuning circuit and the analog-to-digital conversion circuit under a system initialization mode, such that the gain control capacitor array determines a gain capacitor enabling combination according to the operation control signal and operates according to the gain capacitor enabling combination under the operation mode.

4. The signal gain tuning circuit of claim 1, wherein the offset is determined according to a maximum difference or an average power difference between the actual level and the estimated level.

5. The signal gain tuning circuit of claim 1, wherein the coarse-tuning capacitors further comprise:
    a plurality of first coarse-tuning capacitors configured to be enabled in a system initialization mode, wherein the first coarse-tuning capacitors are disabled according to the tuning capacitor enabling combination under the operation mode to tune the gain down; and
    a plurality of second coarse-tuning capacitors configured to be disabled under the system initialization mode, wherein the second coarse-tuning capacitors are enabled according to the tuning capacitor enabling combination under the operation mode to tune the gain up.

6. The signal gain tuning circuit of claim 1, wherein the fine-tuning capacitors further comprise:

a plurality of first fine-tuning capacitors having a first total tuning amount equaling to the first tuning amount when being all enabled; and a plurality of second fine-tuning capacitors having a second total tuning amount equaling to a process variation tuning amount corresponding to the first tuning amount of each of the coarse-tuning capacitors when being all enabled.

7. A signal gain tuning method having adaptive mechanism and used in a signal gain tuning circuit, comprising:

according to an analog signal received from an input interface, generating a tuned analog signal at an output interface to an analog-to-digital conversion circuit by an amplifier;

determining a gain of the tuned analog signal relative to the analog signal by a gain control capacitor array electrically coupled between the input interface and the output interface together with the amplifier;

receiving an actual level of an output digital signal of the analog-to-digital conversion circuit under an operation mode by a control circuit, to determine an offset between the actual level and an estimated level to further generate a tuning control signal according to the offset; and determining a tuning capacitor enabling combination of a coarse-tuning capacitor array and a fine-tuning capacitor array according to the tuning control signal to tune the gain and lower the offset;

wherein the coarse-tuning capacitor array comprises a plurality of coarse-tuning capacitors coupled in parallel to the gain control capacitor array, each of the coarse-tuning capacitors having a first tuning amount relative to a maximum gain of the gain; and the fine-tuning capacitor array comprises a plurality of fine-tuning capacitors coupled in parallel to the gain control capacitor array, each of the fine-tuning capacitors having a second tuning amount relative to the maximum gain, wherein the second tuning amount is smaller than the first tuning amount.

8. The signal gain tuning method of claim 7, further comprising:

determining a plurality of enabling combinations of the coarse-tuning capacitors and the fine-tuning capacitors corresponding to a plurality of tuning amounts within a predetermined tuning range by the control circuit under a calibration mode, to further select one of the enabling combinations according to the offset under the operation mode to generate the tuning control signal.

9. The signal gain tuning method of claim 7, wherein the gain control capacitor array comprises a plurality of The gain control capacitors coupled in parallel and having a plurality of weighted binary tuning amounts relative to the maximum gain, the signal gain tuning method further comprising:

generating an operation control signal according to a transmission wire length between the signal gain tuning circuit and the analog-to-digital conversion circuit by the control circuit under a system initialization mode, such that the gain control capacitor array determines a gain capacitor enabling combination according to the operation control signal and operates according to the gain capacitor enabling combination under the operation mode.

10. The signal gain tuning method of claim 7, further comprising:

determining the offset according to a maximum difference or an average power difference between the actual level and the estimated level.

11. The signal gain tuning method of claim 7, further comprising:

enabling a plurality of first coarse-tuning capacitors of the coarse-tuning capacitors in a system initialization mode and disabling the first coarse-tuning capacitors according to the tuning capacitor enabling combination under the operation mode to tune the gain down; and disabling a plurality of second coarse-tuning capacitors of the coarse-tuning capacitors under the system initialization mode and enabling the second coarse-tuning capacitors according to the tuning capacitor enabling combination under the operation mode to tune the gain up.

12. The signal gain tuning method of claim 7, wherein the fine-tuning capacitors further comprise:

a plurality of first fine-tuning capacitors having a first total tuning amount equaling to the first tuning amount when being all enabled; and a plurality of second fine-tuning capacitors having a second total tuning amount equaling to a process variation tuning amount corresponding to the first tuning amount of each of the coarse-tuning capacitors when being all enabled.

* * * * *